United States Patent
Berger et al.

(10) Patent No.: US 9,015,423 B2
(45) Date of Patent: Apr. 21, 2015

(54) REDUCING STORE OPERATION BUSY TIMES

(75) Inventors: Deanna Postles Dunn Berger, Poughkeepsie, NY (US); Michael F. Fee, Cold Spring, NY (US); Christine C. Jones, Poughkeepsie, NY (US); Arthur J. O'Neill, Poughkeepsie, NY (US); Diane L. Orf, Somerville, MA (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 13/523,567

(22) Filed: Jun. 14, 2012

(65) Prior Publication Data

US 2013/0339606 A1    Dec. 19, 2013

(51) Int. Cl.
| | |
|---|---|
| G06F 12/00 | (2006.01) |
| G06F 13/00 | (2006.01) |
| G06F 13/28 | (2006.01) |
| G06F 12/08 | (2006.01) |
| G06F 9/38 | (2006.01) |
| G11C 7/22 | (2006.01) |

(52) U.S. Cl.
CPC ...... *G06F 12/0806* (2013.01); *G11C 2207/229* (2013.01); *G06F 9/3855* (2013.01); *G11C 7/22* (2013.01); *G06F 12/0855* (2013.01); *G06F 9/38* (2013.01); *Y02B 60/1225* (2013.01)

(58) Field of Classification Search
CPC ... G11C 7/22; G11C 2207/229; G06F 9/3855
USPC .................................................. 711/118, 140
See application file for complete search history.

(56) References Cited

U.S. PATENT DOCUMENTS

| | | | |
|---|---|---|---|
| 5,721,855 A | 2/1998 | Hinton et al. | |
| 5,765,016 A | 6/1998 | Walker | |
| 6,356,485 B1 * | 3/2002 | Proebsting | 365/189.16 |
| 6,539,471 B2 | 3/2003 | Shaeffer | |
| 6,779,104 B2 | 8/2004 | Sheaffer | |
| 7,486,558 B2 * | 2/2009 | Li | 365/185.12 |
| 7,711,898 B2 | 5/2010 | Sodani et al. | |
| 8,006,075 B2 | 8/2011 | Luttrell | |
| 8,140,769 B2 | 3/2012 | Luttrell | |
| 8,166,251 B2 | 4/2012 | Luttrell | |
| 2009/0282225 A1 * | 11/2009 | Caprioli et al. | 712/225 |
| 2010/0293347 A1 | 11/2010 | Luttrell | |
| 2010/0299508 A1 | 11/2010 | Luttrell | |
| 2010/0306477 A1 | 12/2010 | Luttrell | |
| 2011/0264862 A1 | 10/2011 | Karlsson et al. | |
| 2012/0079245 A1 | 3/2012 | Wang et al. | |
| 2012/0079246 A1 | 3/2012 | Breternitz et al. | |
| 2012/0079488 A1 | 3/2012 | Phillips et al. | |

\* cited by examiner

*Primary Examiner* — Ryan Bertram

(74) *Attorney, Agent, or Firm* — Cantor Colburn LLP; Margaret McNamara (57) ABSTRACT

A computer product for reducing store operation busy times is provided and relates to associating first and second platform registers with a cache array, determining that first and second store operations target a same wordline of the cache array, loading control information and data of the store operations into the platform registers and delaying a commit of the first store operation until the loading of the second platform register is complete. The method further includes committing the data from the platform registers using the control information from the platform registers to the wordline of the cache array at a same time to thereby reduce a busy time of the wordline of the cache array.

13 Claims, 6 Drawing Sheets

REDUCING STORE OPERATION BUSY TIMES

BACKGROUND

Embodiments relate to improving cache utilization and, more specifically, to reducing cache utilization by reducing store operation busy times.

A cache of a central processing unit (CPU) is a cache used by the CPU of a computer to reduce an average time to access memory. The cache is a small, fast memory that stores copies of data from frequently used main memory locations. As long as most memory accesses are cached memory locations, an average latency of memory accesses will be closer to the cache latency than to the latency of main memory.

When the CPU needs to read from or write to a location in main memory, the CPU first checks whether a copy of that data is in the cache. If so, the CPU immediately reads from or writes to the cache, which is much faster than reading from or writing to main memory. Modern CPUs may have at least three independent caches: an instruction cache to speed up executable instruction fetch, a data cache to speed up data fetch and store operations and a translation lookaside buffer (TLB) used to speed up virtual-to-physical address translation for both executable instructions and data. The data cache is usually organized as a hierarchy of more cache levels.

SUMMARY

According to exemplary embodiments, a computer program product for reducing store operation busy times is provided. The computer program product includes a tangible storage medium readable by a processing circuit and storing instructions for execution by the processing circuit for performing a method. The method includes associating first and second platform registers with a cache array, determining, by a comparator, that a first store operation targets a wordline of the cache array, determining, by the comparator, that a second store operation targets the same wordline of the cache array, loading control information and data of the first and second store operation into the first and second platform registers and delaying, by a buffer, a commit of the first store operation until the control information and data of the second store operation is loaded into the second platform register. The method further includes committing the data from the first and second platform registers using the control information from the first and second platform registers to the wordline of the cache array at a same time to thereby reduce a busy time of the wordline of the cache array.

According to further exemplary embodiments, a system for reducing penalties for reducing store operation busy times is provided. The system includes a cache array, first and second platform registers associated with the cache array, a comparator and a buffer, the system configured to perform a method. The method includes determining, by the comparator, that a first store operation targets a wordline of the cache array, determining, by the comparator, that a second store operation targets the same wordline of the cache array, loading control information and data of the first and second store operation into the first and second platform registers and delaying, by the buffer, a commit of the first store operation until the control information and data of the second store operation is loaded into the second platform register. The method further includes committing the data from the first and second platform registers using the control information from the first and second platform registers to the wordline of the cache array at a same time to thereby reduce a busy time of the wordline of the cache array.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

The aggressive timing of fetch operations can be maintained while store operations are allowed to have the same pipeline initiation timing as fetch operations to thereby eliminate preemptive blocking by a scheduling model. This is achieved by a loading of both write control information and write data of a store operation into platform registers that are respectively associated with and disposed proximate to the cache arrays of the store operation. The scheduling model and store commit logic then initiates a cache store operation to the cache arrays with the same pipeline initiation timing as a fetch operation to eliminate preemptive blocking and a need for two different busy models for store operations and fetch operations.

In addition, compare logic and buffering may be introduced to the platform register design to determine if first and second store operations target a same wordline of a cache element. If so, the store commit of the first store operation may be delayed to allow the first and second store operations to be committed from their respective platform registers at a same time to minimize busy time and to save power.

To improve performance of cache accessing operations, it is often advantageous to initiate different cache accessing operations at different cycles in the pipeline. For example, to improve fetch performance, all the cache sets can be read preemptively and the desired content selected with the directory hit results. A store, on the other hand, must wait for the hit results before the targeted cache is known. For this reason, stores are committed to the cache later in the pipeline than fetches.

Committing stores later in the pipeline requires the scheduling model to block newer fetch requests to prevent a collision. This preemptive blocking occurs because the scheduling model anticipates that the store will busy the cache later in the pipeline and prevents fetches from colliding with stores. As the busy times of the cache array elements get longer, as with eDRAM or phase-change storage devices, preemptive blocking degrades cache availability.

Figure 1:
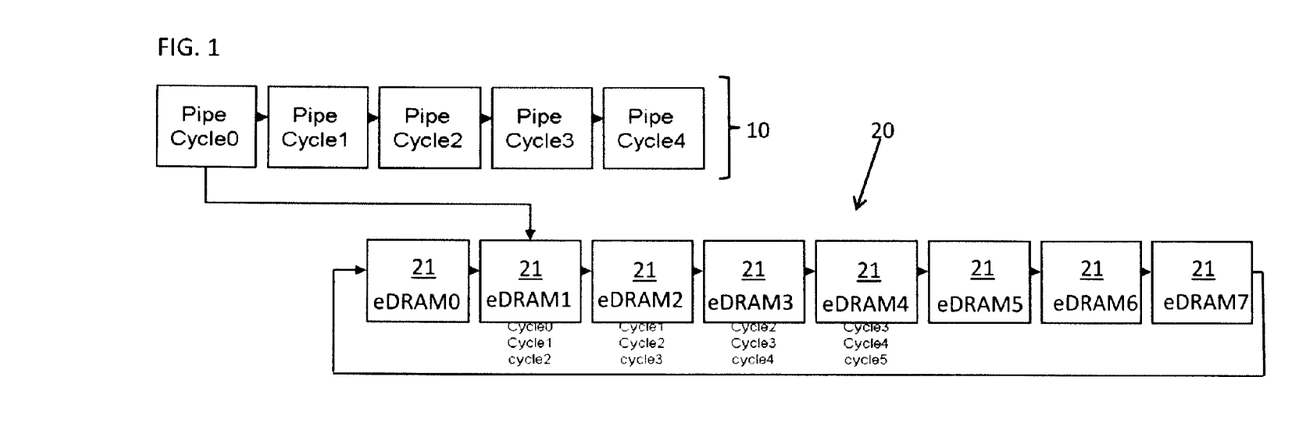
FIG. 1 is a conventional fetch operating timing diagram.

Turning now to FIG. 1, an independent pipe passage 10 is provided with sequential pipe cycles 0, 1, ..., 4. In addition, a cache 20 is provided with a never ending sequence of cache arrays 21. The cache arrays 21 may include, for example, dynamic random access memory (DRAM) or embedded dynamic random access memory (eDRAM), such as eDRAM0, eDRAM 1, ..., eDRAM 7. When a fetch operation goes through the pipe passage 10, the fetch operation initiates a read command in an early pipe cycle (i.e., pipe cycle 0). The read command and address are then supplied to the cache 20 in the next pipe cycle (i.e., pipe cycle 1) whereupon the cache 20 is preemptively read and a directory hit is supplied in a subsequent pipe cycle (i.e., pipe cycle 2) to mux down the fetch data. The fetch operation can thus initiate and access the cache array 21 at cycle0 of eDRAM 1, as shown, with at least cycle1 and cycle 2 of eDRAM 1 remaining busied such that no further fetch or store operations can be executed. Further eDRAM 2, 3, 4 and so on may be accessed sequentially to complete the access of data from the cache. Each cache read may access one or all of the eDRAMs of the cache 20.

Figure 2:
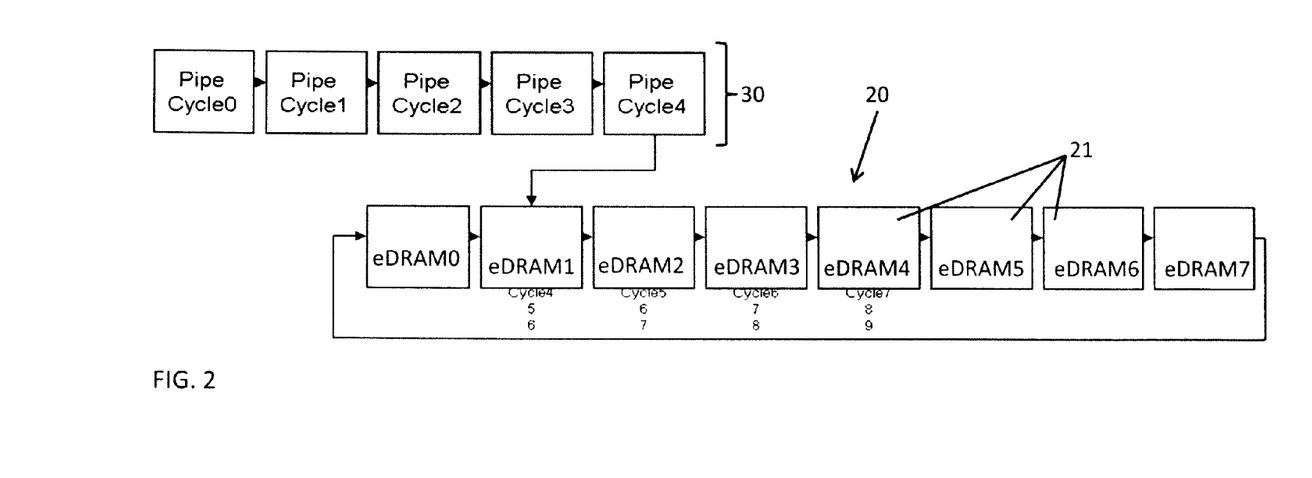
FIG. 2 is a conventional store operation timing diagram.

Turning now to FIG. 2, another independent pipe passage 30 is provided with sequential pipe cycles 0, 1, ..., 4. Again, a cache 20 is provided with a never ending sequence of cache arrays 21 that may include, for example, eDRAM 0, eDRAM, ..., eDRAM 7. When a store operation goes through the pipe passage 30, the store operation has to move both the store data and a hit line to the cache 20 before the store operation can be completed, which can therefore be as late as pipe cycle 4. Other eDRAMs may be stored to sequentially to write the entire set of data to the cache 20. One or all of the eDRAMs may be written on a given store operation.

Figure 3:
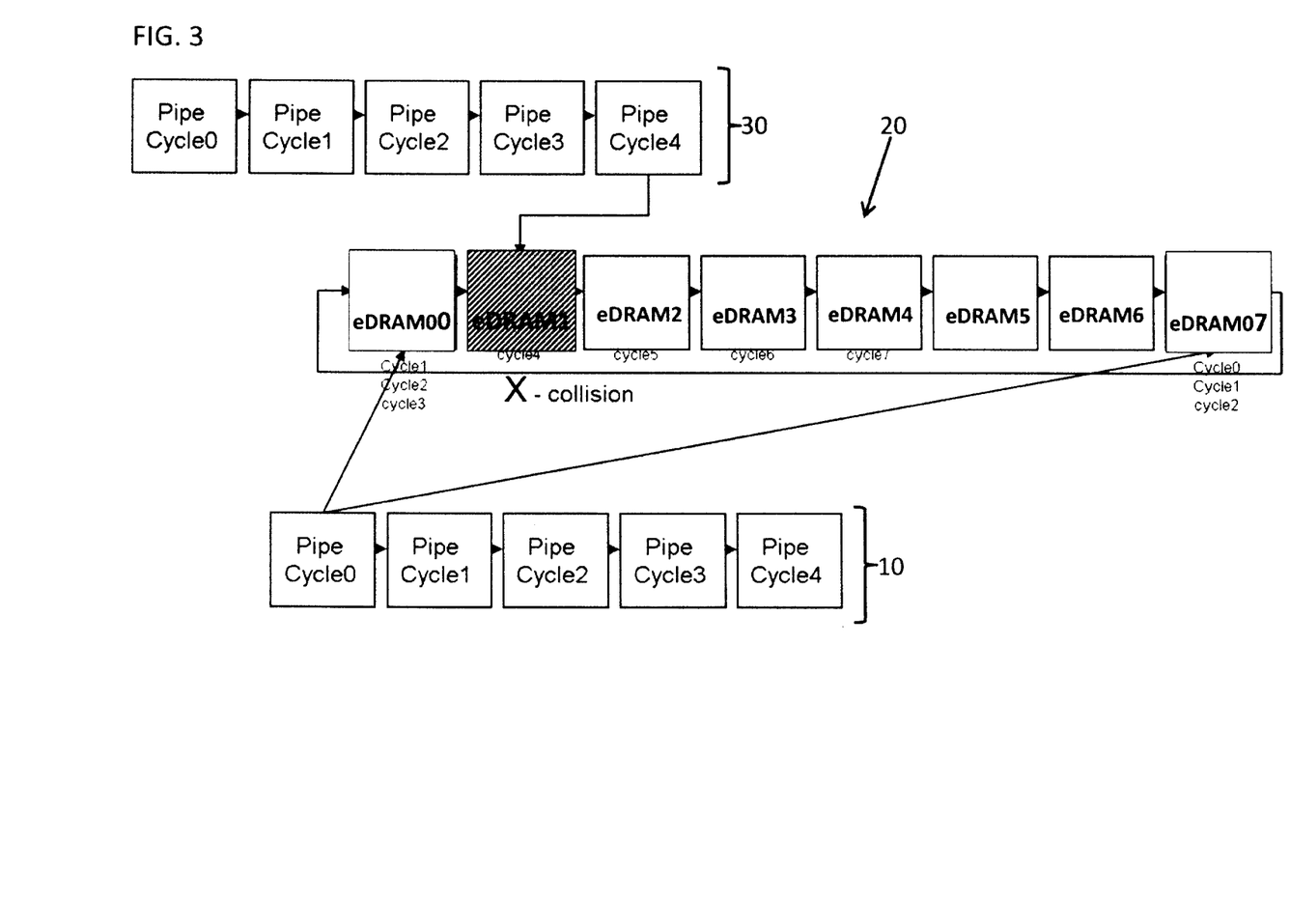
FIG. 3 is a conventional scheduling model diagram in which fetch and store operations are conducted.

When fetch operations and store operations are both executed with respect to the cache 20, the store operations require that the scheduling model of the cache 20 be penalized preemptively in anticipation of the store operations busying the cache 20 in later pipe cycle to prevent fetch operations and store operations from colliding. Such collisions may be understood with reference to FIG. 3. As shown in FIG. 3, pipe passage 10 has a fetch operation going through it and is independent from pipe passage 30, which has a store operation going through it. Since the store operation needs to wait for data to reach the cache 20, the store operation if executed on eDRAM 1 cannot be completed until pipe cycle 4 with at least cycle 5 and cycle 6 of eDRAM 1 busied (shown by the X-collision text in FIG. 3). This means that the next fetch operation in pipe passage 10 cannot target eDRAM 0, eDRAM 6 or eDRAM 7 as doing so would lead to a collision of the store operation and the fetch operation.

Figure 4:
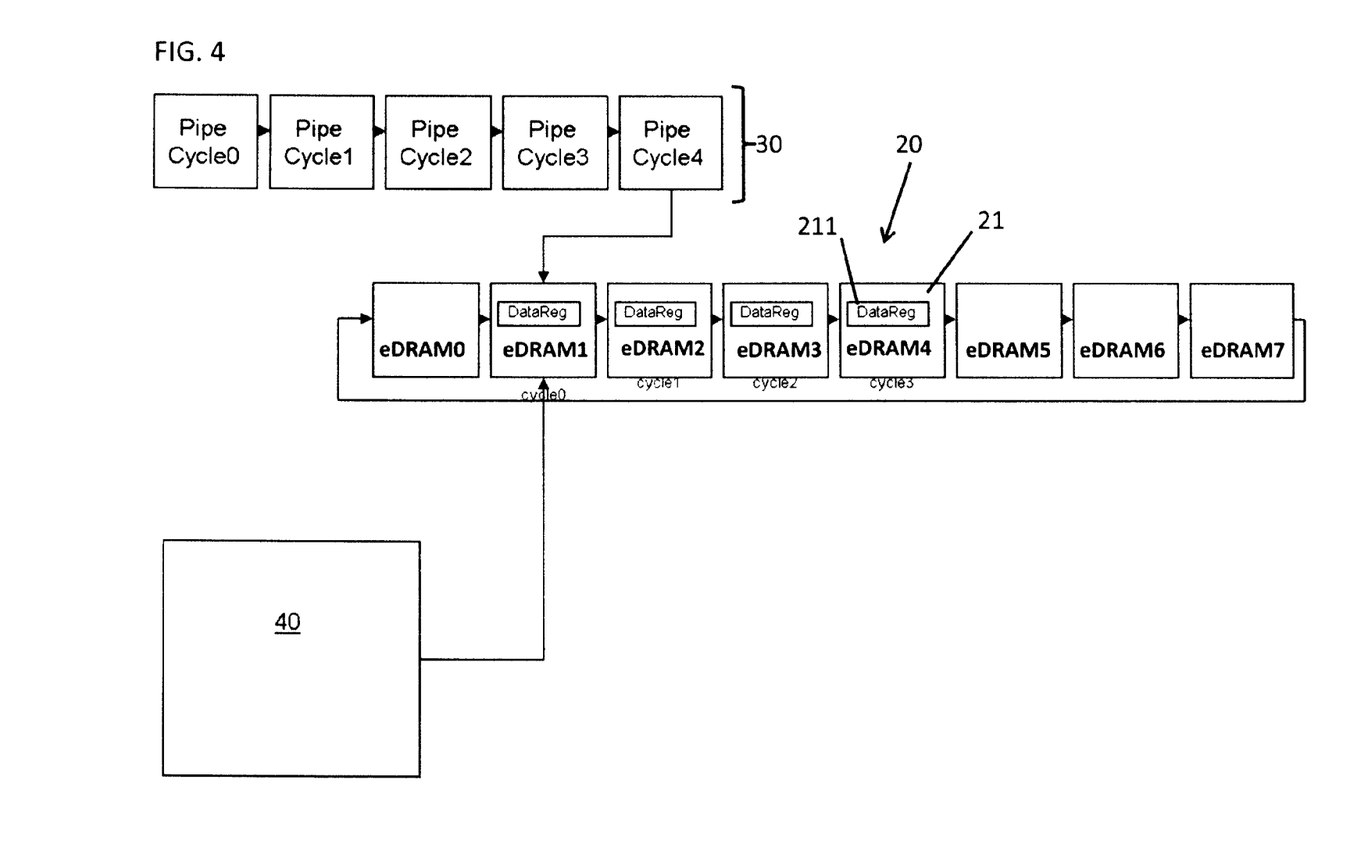
FIG. 4 is a diagram of a store operation making use of platform registers in accordance with an embodiment.

With reference to FIG. 4, aggressive timing of fetch operations can be maintained while store operations are allowed to have the same pipeline initiation timing as fetch operations to thereby eliminate preemptive blocking by a scheduling model. This is made possible by respectively associating platform registers 211 with the cache arrays 21 of the cache 20. In some cases, the platform registers 211 may be disposed proximate to the cache arrays 21. In further cases, the cache arrays 21 may include dynamic random access memory (DRAM) or embedded dynamic random access memory (eDRAM).

Write control information and write data of a store operation to be executed with respect to one or more of the cache arrays 21 is then loaded into the one or more of the platform registers 211 respectively associated with the one or more of the cache arrays. This loading is achieved by a coupling at least temporarily defined between a relevant pipe passage and the one or more platform registers 211. The one or more of the cache arrays 21 may be identified from the store operation itself. That is, upon receipt of an instruction to execute the store operation, details of the store operation maybe analyzed. Such details may include addresses and identification information of the one or more of the cache arrays 21. In accordance with results of the analyzing, the one or more of the cache arrays 21 with respect to which the store operation is to be executed may be identified.

With the control information and data loaded into the one or more of the platform registers 211, implemented platform register commit logic 40 is primed. The platform register commit logic 40 may be embodied as a tangible storage medium readable by a processing circuit and storing instructions for execution by the processing circuit. The platform register commit logic 40 determines that the one or more of the cache arrays 21 is or is not available. Moreover, based on the one or more of the cache arrays 21 becoming available, the data is committed from the one or more of the platform registers 211 to the one or more of the cache arrays 21 using the control information of the same platform registers 211. As shown in FIG. 4, this commit is executed with timing that is similar to the timing of a corresponding fetch operation that has a similar size as the store operation. That is, the commit is executed to appear to happen on cycle0 of eDRAM 1 relative to a corresponding fetch operation and thus prevents the need for pre-blocking the fetch operation.

With the commit of the data to the one or more of the cache arrays 21 completed, the one or more of the platform registers 211 are made available for other store operations.

Figure 5:
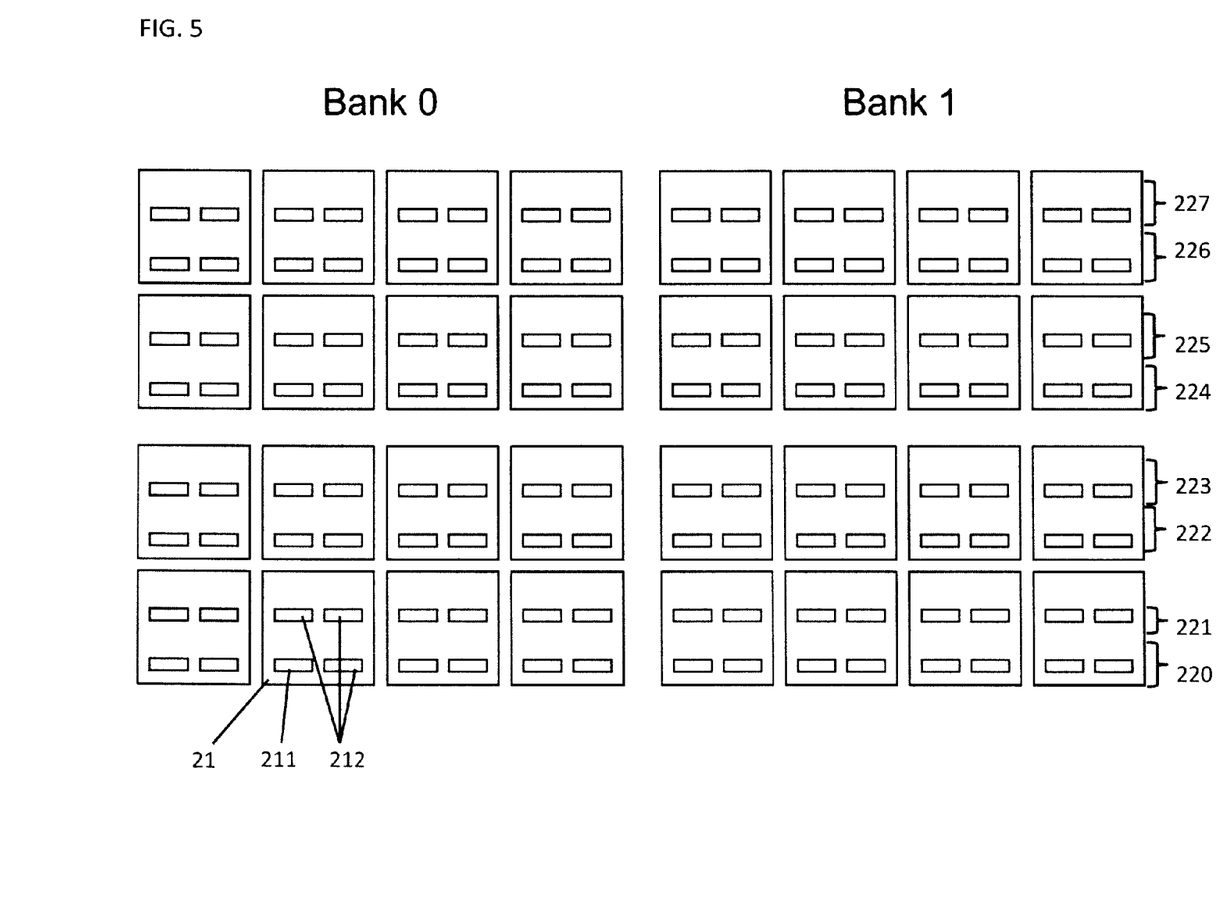
FIG. 5 is a schematic diagram of a cache array organized into banks.

As illustrated in FIG. 4, each cache array 21 may have a single platform register 211 associated with it in accordance with embodiments. However, in accordance with further embodiments and, with reference to FIG. 5, it is to be understood that each cache array 21 may be organized into a bank of cache arrays 21 (i.e., bank 0 and bank 1) and that each cache array 21 may have a primary platform register 211 associated with it as well as alternate platform registers 212 associated with it. As shown in FIG. 5, the cache arrays 21 in banks 0 and 1 are arranged such that its primary platform register 211 and alternate platform registers 212 are similarly disposed along wordlines 220-227.

Store operations are generally performed in small segments of a 256 byte (B) double line, such as a 32B octword, with two or more 32B octwords of a line on the same wordline in eDRAM. Because the power and busy time cost of activating a wordline is high, it is advantageous to use as much data as possible off of that wordline activation before activating another wordline. For example, during a fetch operation, the more data that is read from a single wordline means that less overall wordlines have to be activated and less power is used with more available for other operations. A core may be sending many stores to one particular wordline. If there are two or more 32B octwords from a line kept in one eDRAM wordline and these are sent in as two (or more) discreet stores this would normally be treated as multiple separate activations to the wordline.

Figure 6:
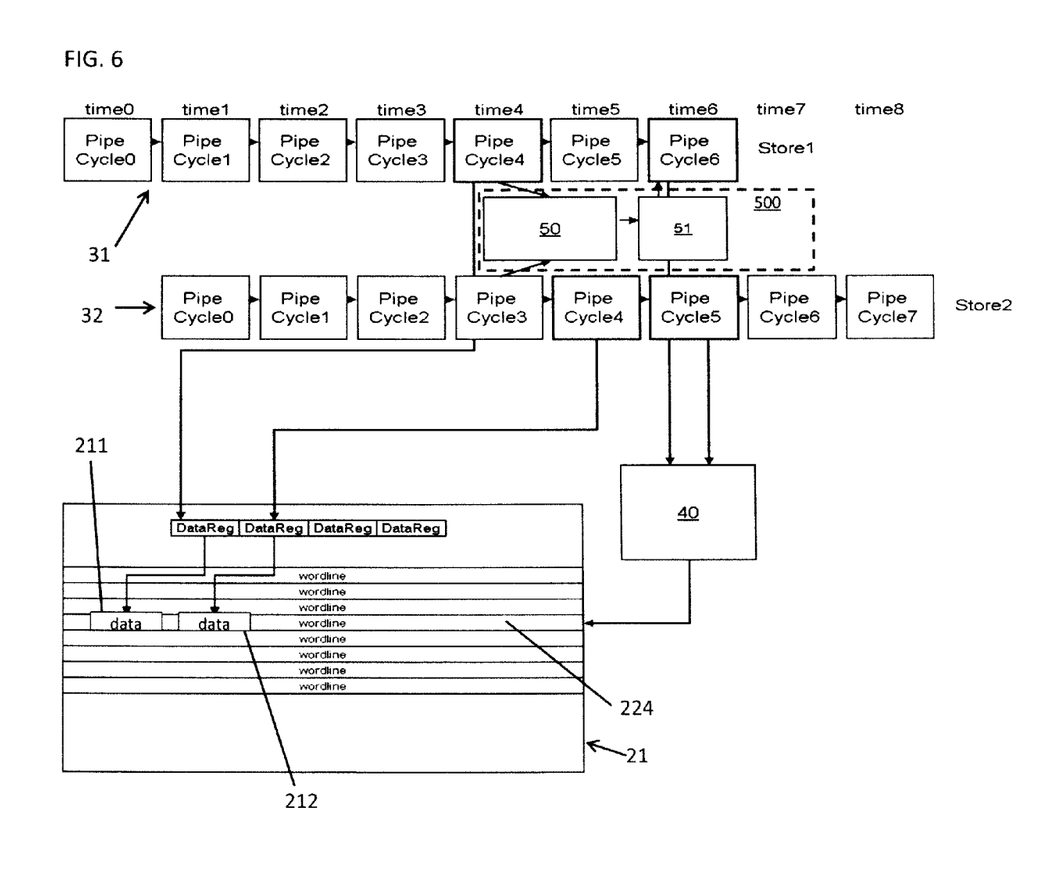
FIG. 6 is a diagram of store operations making use of platform registers on a same wordline in accordance with embodiments.

In accordance with embodiments and, with reference to FIG. 6, store operations 1 and 2 pass through pipe passage 31 and pipe passage 32 in a back-to-back sequence and target the same wordline (e.g., wordline 224) in cache array 21 via primary platform register 211 and (at least) one of the alternate platform registers 212. Normally, when a store operation is executed on an eDRAM cache array, the store operation busies the eDRAM/wordline for multiple cycles, as noted above. Such a situation would, therefore, usually prevent a subsequent store operation from being committed even by platform register commit logic 40 until later in the pipe cycle as the subsequent store operation will have to be delayed for the busy time of the eDRAM/wordline to pass.

As shown in FIG. 6, however, a processor 500 is provided and includes a comparator 50 and a buffer 51. The comparator 50 is configured to compare the target eDRAM/wordline address associated with store operation 1 with the target eDRAM/wordline address associated with store operation 2. The illustrated example shows that store operation 1 is in the $4^{th}$ pipe cycle (i.e., pipe cycle 4) as store operation 2 is in the $3^{rd}$ pipe cycle (i.e., pipe cycle 3). In this example, the comparing is executed by the comparator 50 at that time and before the platform register commit logic 40 executes the commit for store operation 1. If logic of the comparator 50 detects that the two eDRAM/wordline addresses for store operations 1 and 2 are targeting the same eDRAM/wordline, the comparator 50 issues a delay signal to the buffer 51 that delays a start of the commit for store operation 1 from the primary platform register 211 until the control information and data of store operation 2 are loaded into the alternate platform register 212. The logic of the comparator 50 also determines that, since store operation 1 and store operation 2 are to be executed with respect to the same wordline, the platform register commit logic 40 can execute the commit for each store operation at the same time.

Based on the control information and data of store operation 2 being loaded into the alternate platform register 212, the wordline 224 is activated. Such activation need only be conducted once to save power and to reduce busy times of the wordline 224. Once the wordline 224 is activated the commit for store operation 1 and store operation 2 can be conducted by the platform register commit logic 40 at the same time (i.e., simultaneously). As this example shows, executing the commit for both store operation 1 and store operation 2 at the same time causes both stores to be committed into the cache array 21 sooner than would otherwise be possible and reduces an amount of time the eDRAMs are busy as well a power level that would otherwise be required for both store operations.

As will be appreciated by one skilled in the art, one or more aspects may be embodied as a system, method or computer program product. Accordingly, one or more aspects may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 7:
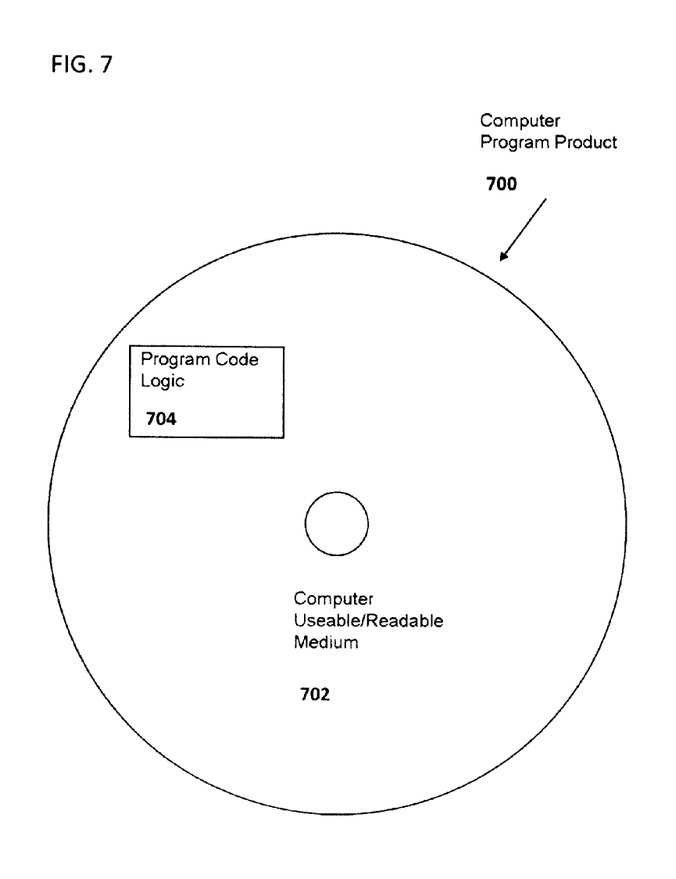
FIG. 7 illustrates a computer program product in accordance with an embodiment.

Referring now to FIG. 7, in one example, a computer program product 700 includes, for instance, one or more storage media 702, wherein the media may be tangible and/or non-transitory, to store computer readable program code means or logic 704 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the embodiments.

Embodiments include a method, system and computer program product for reducing store operation busy times. The method includes associating first and second platform registers with a cache array, determining that a first store operation targets a wordline of the cache array, determining that a second store operation targets the same wordline of the cache array, loading control information and data of the first and second store operation into the first and second platform registers, delaying a commit of the first store operation until the control information and data of the second store operation is loaded into the second platform register and committing the data from the first and second platform registers using the control information from the first and second platform registers to the wordline of the cache array at a same time to thereby reduce a busy time of the wordline of the cache array.

In an embodiment, the first platform register includes a primary platform register and the second platform register includes an alternate platform register.

In an embodiment, the method further includes associating multiple alternate platform registers with the cache array.

In an embodiment, the method further includes activating the wordline of the cache array.

In an embodiment, the method further includes activating the wordline of the cache array once for the first and second store operations.

In an embodiment, the determining that the first store operation targets a wordline of the cache array and the determining that the second store operation targets the same wordline of the cache array include comparing the first and second store operations.

In an embodiment, the comparing of the first and second store operations includes comparing store operation addresses of the first and second store operations.

In an embodiment, the method further includes issuing a delay signal based on a determination that the first and second store operations target a same wordline of the cache array.

Technical effects and benefits permit the aggressive timing of fetch operations to be maintained while store operations are allowed to have the same pipeline initiation timing as fetch operations to thereby eliminate preemptive blocking by a scheduling model. This is achieved by a loading of both write control information and write data of a store operation into platform registers that are respectively associated with and disposed proximate to the cache arrays of the store operation. The scheduling model and store commit logic then initiates a cache store operation to the cache arrays with the same pipeline initiation timing as a fetch operation to eliminate preemptive blocking and a need for two different busy models for store operations and fetch operations.

Technical effects and benefits also introduce compare logic to the platform register design to determine if first and second store operations target a same wordline of a cache element. If so, the store commit of the first store operation may be delayed to allow the first and second store operations to be committed from their respective platform registers at a same time to minimize busy time and to save power.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A non-transitory computer-readable storage medium for reducing store operation busy times, the computer program product comprising:
    a tangible storage medium readable by a processing circuit and storing instructions for execution by the processing circuit for performing a method comprising:
    associating first and second platform registers with a cache array such that the first and second platform registers are disposed along a same wordline of the cache array;
    determining, by a comparator, that first and second store operations target the same wordline of the cache array on which the first and second platform registers are disposed;
    loading control information and data of the first and second store operation into the first and second platform registers;
    delaying, by a buffer, a commit of the first store operation to the same wordline of the cache array until the control information and data of the second store operation is loaded into the second platform register; and
    committing the data from the first and second platform registers using the control information from the first and second platform registers to the same wordline of the cache array at a same time to thereby reduce a busy time of the same wordline of the cache array.

2. The computer program product according to claim 1, wherein the first platform register comprises a primary platform register and the second platform register comprises an alternate platform register, and wherein the method further comprises associating multiple alternate platform registers with the cache array.

3. The computer program product according to claim 1, wherein the method further comprises activating the same wordline of the cache array once for the first and second store operations.

4. The computer program product according to claim 1, wherein the determining that the first and second store operations target the same wordline of the cache array comprises comparing the first and second store operations.

5. The computer program product according to claim 4, wherein the comparing of the first and second store operations comprises comparing store operation addresses of the first and second store operations.

6. The computer program product according to claim 1, wherein the method further comprises issuing a delay signal based on a determination that the first and second store operations target the same wordline of the cache array.

7. A system for reducing penalties for reducing store operation busy times, the system comprising:
   a cache array;
   a first platform register associated with the cache array such that the first platform register is disposed on a wordline of the cache array;
   multiple second platform registers associated with the cache array such that one second platform is disposed on the same wordline of the cache array as the first platform register and other second platform registers are disposed on another wordline of the cache array;
   a comparator; and
   a buffer,
   the system being configured to perform a method comprising:
   determining, by the comparator, that first and second store operations target the same wordline of the cache array on which the first platform register and the one second platform register are disposed;
   loading control information and data of the first and second store operation into the first and second platform registers;
   delaying, by the buffer, a commit of the first store operation to the same wordline of the cache array until the control information and data of the second store operation is loaded into the second platform register; and
   committing the data from the first and second platform registers using the control information from the first and second platform registers to the same wordline of the cache array at a same time to thereby reduce a busy time of the same wordline of the cache array.

8. The system according to claim 7, wherein the first platform register comprises a primary platform register and the multiple second platform registers respectively comprise alternate platform registers.

9. The system according to claim 7, wherein the method further comprises activating the same wordline of the cache array.

10. The system according to claim 7, wherein the method further comprises activating the same wordline of the cache array once for the first and second store operations.

11. The system according to claim 7, wherein the determining that the first and second store operations targets the same wordline of the cache array comprises comparing the first and second store operations.

12. The system according to claim 11, wherein the comparing of the first and second store operations comprises comparing store operation addresses of the first and second store operations.

13. The system according to claim 7, wherein the method further comprises issuing a delay signal based on a determination that the first and second store operations target the same wordline of the cache array.

* * * * *